United States Patent [19]
Wilson et al.

[11] Patent Number: 6,086,678
[45] Date of Patent: Jul. 11, 2000

[54] PRESSURE EQUALIZATION SYSTEM FOR CHEMICAL VAPOR DEPOSITION REACTORS

[75] Inventors: Gregory M. Wilson, Chesterfield; Michael J. Ries, St. Charles; Thomas A. Torack, Oakland, all of Mo.

[73] Assignee: MEMC Electronic Materials, Inc., St. Peters, Mo.

[21] Appl. No.: 09/262,417

[22] Filed: Mar. 4, 1999

[51] Int. Cl.[7] .................................................. C23C 16/00
[52] U.S. Cl. ............................................................ 118/715
[58] Field of Search ........................... 118/719; 414/219, 414/939; 438/758

[56] References Cited

U.S. PATENT DOCUMENTS

| | | | |
|---|---|---|---|
| 4,592,306 | 6/1986 | Gallego | 118/719 |
| 5,700,127 | 12/1997 | Harada | 414/217 |
| 5,766,360 | 6/1998 | Sato | 118/719 |

*Primary Examiner*—Richard Bueker
*Attorney, Agent, or Firm*—Senniger, Powers, Leavitt & Roedel

[57] ABSTRACT

A system for equalizing pressure across a gate adapted to selectively block a port connecting a wafer handling chamber to a process chamber of a reactor for depositing an epitaxial layer on a semiconductor wafer positioned in the process chamber. The system comprises a bypass passage connecting the process chamber to the wafer handling chamber for transporting gas between the process chamber and the wafer handling chamber when the gate is blocking the port connecting the wafer handling chamber to the process chamber of the reactor for equalizing pressure between the process chamber and the wafer handling chamber. The system also includes a bypass valve positioned along the bypass passage for selectively controlling gas flow through the bypass passage. The bypass valve has an open position in which gas is permitted to flow through the bypass passage to equalize pressure between the process chamber and the wafer handling chamber and a closed position in which gas is prevented from flowing through the bypass passage to isolate the process chamber from the wafer handling chamber. In addition, the system includes a flow restrictor positioned along the bypass passage for restricting gas flow through the bypass passage to limit pressure change rates in the process chamber and the wafer handling chamber when the bypass valve is in the open position and thereby to limit a maximum velocity of gas flowing through the bypass passage.

22 Claims, 3 Drawing Sheets

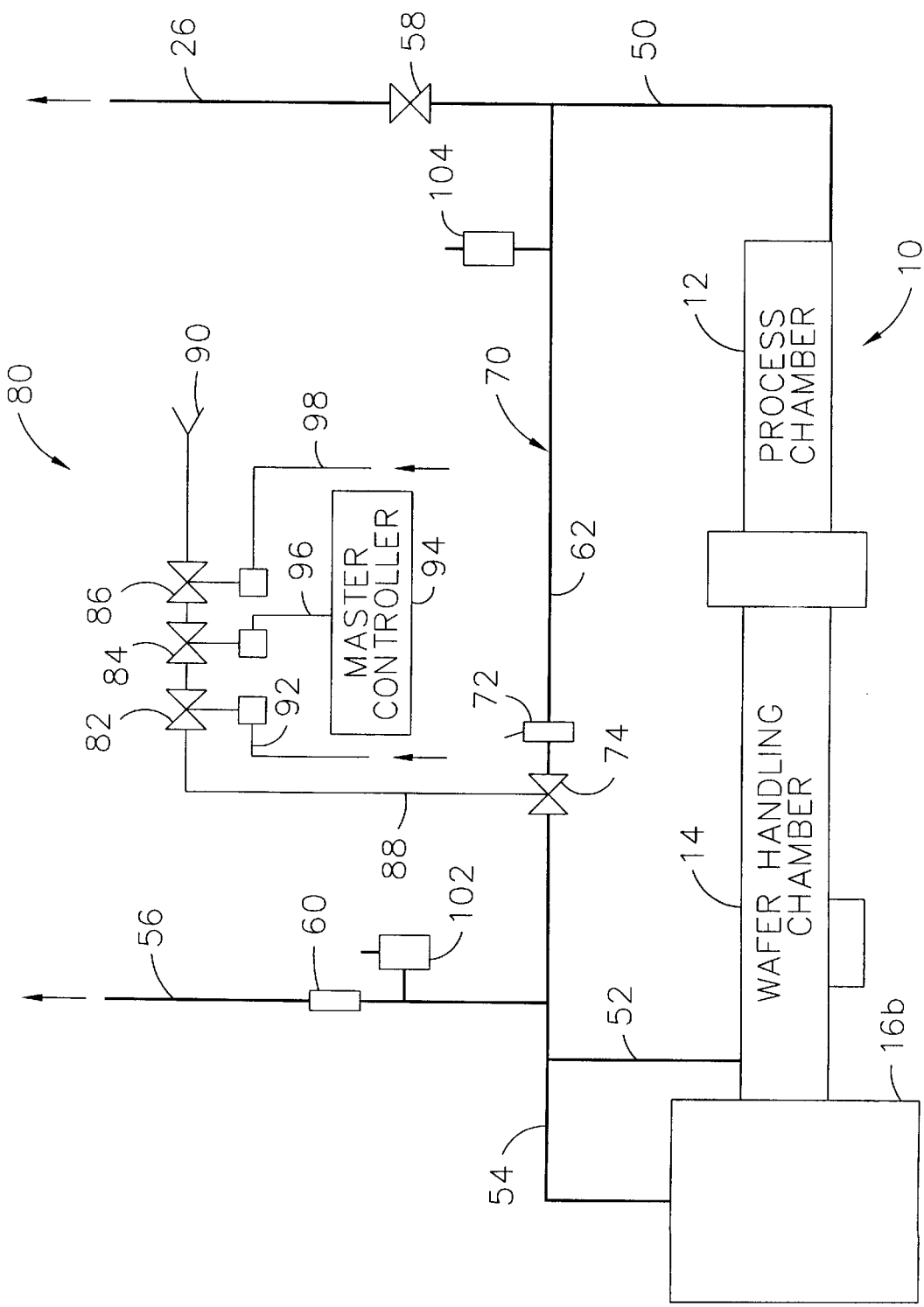

PRESSURE EQUALIZATION SYSTEM FOR CHEMICAL VAPOR DEPOSITION REACTORS

BACKGROUND OF THE INVENTION

The present invention relates generally to a reactor for depositing an epitaxial layer on a semiconductor wafer, and more specifically to a reactor having a system for equalizing pressure across a gate separating a process chamber of the reactor from a wafer handling chamber.

Conventional horizontal reactors have a process chamber sized and shaped for receiving a semiconductor wafer. When a wafer is loaded, reactant gas is injected into the chamber for depositing an epitaxial layer on the wafer by a process known as chemical vapor deposition. The process chamber is connected to one end of a wafer handling chamber and two load locks are positioned at the other end of the wafer handling chamber so wafers pass through the wafer handling chamber when being transported from the load locks to the process chamber and from the process chamber to the load locks. A port separates the wafer handling chamber from the process chamber and a gate positioned adjacent the port selectively blocks the port to isolate the process chamber during the chemical vapor deposition and unblocks the port to load and unload the wafers.

A conventional Bernoulli wand is sometimes used to transport the wafers between the load locks and the process chamber. The wand includes a horizontally oriented paddle having nozzles directing gas jets generally outward and slightly downward from its lower surface. The gas jets create a vacuum beneath the wand for lifting the wafer without touching it.

The pressures in the process chamber and wafer handling chamber vary with respect to one another throughout the process cycle due to factors such as introduction of purge gas or introduction of gas from the Bernoulli wand. During the wafer loading and unloading steps, the pressure in the process chamber may be different than the pressure in the wafer handling chamber so that when the gate is opened, gas rushes through the port separating the chambers to equalize the pressure in the chambers. Under some circumstances, the pressure differential can cause contaminate laden gas to flow into the chambers through their respective vents. Further, material deposited during previous depositions can be dislodged by gas rushing through the process chamber, the wafer handling chamber and the load locks as pressure is equalized. This dislodged material and other contaminates may settle on wafers, thereby degrading their quality. As a result, it is desirable to equalize the pressure in the process chamber with the pressure in the wafer handling chamber before opening the gate.

SUMMARY OF THE INVENTION

Among the several objects and features of the present invention may be noted the provision of a system which reduces contamination of wafers in chemical vapor deposition processing; the provision of such a system which inhibits introducing particulate matter in gas flowing over the wafer; the provision of such a system which equalizes the pressure in the process chamber with the pressure in the wafer handling chamber; and the provision of a system which limits the speed at which gas flows through the chambers to minimize contamination of wafers.

Briefly, this invention includes a system for equalizing pressure across a gate adapted to selectively block a port connecting a wafer handling chamber to a process chamber of a reactor for depositing an epitaxial layer on a semiconductor wafer positioned in the process chamber. The system comprises a bypass passage connecting the process chamber to the wafer handling chamber for transporting gas between the process chamber and the wafer handling chamber when the gate is blocking the port connecting the wafer handling chamber to the process chamber of the reactor for equalizing pressure between the process chamber and the wafer handling chamber. The system also includes a bypass valve positioned along the bypass passage for selectively controlling gas flow through the bypass passage. The bypass valve has an open position in which gas is permitted to flow through the bypass passage to equalize pressure between the process chamber and the wafer handling chamber and a closed position in which gas is prevented from flowing through the bypass passage to isolate the process chamber from the wafer handling chamber. In addition, the system includes a flow restrictor positioned along the bypass passage for restricting gas flow through the bypass passage to limit pressure change rates in the process chamber and the wafer handling chamber when the bypass valve is in the open position and thereby to limit a maximum velocity of gas flowing through the bypass passage.

In another aspect, the invention includes a reactor for depositing an epitaxial layer on a semiconductor wafer by a chemical vapor deposition process comprising a process chamber sized and shaped for receiving a semiconductor wafer. The process chamber has an opening sized for inserting the wafer into chamber prior to the chemical vapor deposition process and removing the wafer from the chamber after the chemical vapor deposition process. The reactor includes a wafer handling chamber for staging wafers prior to insertion into the process chamber and retaining wafers after removal from the process chamber. The wafer handling chamber has an opening aligned with the opening of the process chamber forming a port connecting the wafer handling chamber to the process chamber through which the wafer passes when being inserted into the process chamber and removed from the process chamber. In addition, the reactor includes a gate for selectively blocking the port connecting the wafer handling chamber to the process chamber. The gate has an open position in which the gate is spaced from the port for inserting wafers into the process chamber prior to chemical vapor deposition and for removing wafers from the chamber after chemical vapor deposition and a closed position in which the gate is sealed against the port to prevent gas flow through the port and thereby isolate the process chamber from the wafer handling chamber during the chemical vapor deposition process. Further, the reactor includes a bypass passage connecting the process chamber to the wafer handling chamber for transporting gas between the process chamber and the wafer handling chamber when the gate is blocking the port connecting the wafer handling chamber to the process chamber for equalizing pressure between the process chamber and the wafer handling chamber. The reactor also includes a bypass valve positioned along the bypass passage for selectively controlling gas flow through the bypass passage. The bypass valve has an open position in which gas is permitted to flow through the bypass passage to equalize pressure between the process chamber and the wafer handling chamber and a closed position in which gas is prevented from flowing through the bypass passage to isolate the process chamber from the wafer handling chamber during the chemical vapor deposition process. Moreover, the reactor includes a flow restrictor positioned along the bypass passage for restricting flow through the bypass passage to limit pressure change rates in the process chamber and the wafer handling chamber when the bypass valve is in the open position and thereby to limit a maximum velocity of gas flowing through the bypass passage.

In yet another aspect, the present invention includes a method of operating a reactor for depositing an epitaxial layer on a semiconductor wafer by a chemical vapor deposition process. The method comprises the step of opening a bypass passage connecting a process chamber of the reactor and a wafer handling chamber of the reactor to permit restricted flow through the bypass passage and to equalize pressure in the process chamber and the wafer handling chamber. The method also includes the steps of opening a gate between the process chamber and the wafer handling chamber once pressure is equalized in the process chamber and the wafer handling chamber, loading a semiconductor wafer in the process chamber, sealing the loaded process chamber, and introducing reactant gas into the sealed chamber.

In still another aspect, the present invention includes a method comprising the steps of loading a semiconductor wafer in a process chamber of the reactor, sealing the loaded process chamber, and introducing reactant gas into the sealed chamber. The method also includes the steps of venting the reactant gas from the process chamber through a vent passage, restricting flow through the vent passage once the reactant gas is vented from the process chamber, and opening a bypass passage connecting the process chamber and a wafer handling chamber to permit restricted flow through the bypass passage and to equalize pressure in the process chamber and the wafer handling chamber. In addition, the method includes the steps of opening a gate between the process chamber and the wafer handling chamber once pressure is equalized in the process chamber and the wafer handling chamber, and removing the wafer from the process chamber into the wafer handling chamber.

Other objects and features of the present invention will be in part apparent and in part pointed out hereinafter.

BRIEF DESCRIPTION OF THE DRAWINGS

FIG. 3 is a schematic showing a system of the present invention for equalizing pressure between a wafer handling chamber and a process chamber of the reactor.

Corresponding reference characters indicate corresponding parts throughout the several views of the drawings.

DETAILED DESCRIPTION OF THE PREFERRED EMBODIMENT

Figure 1:
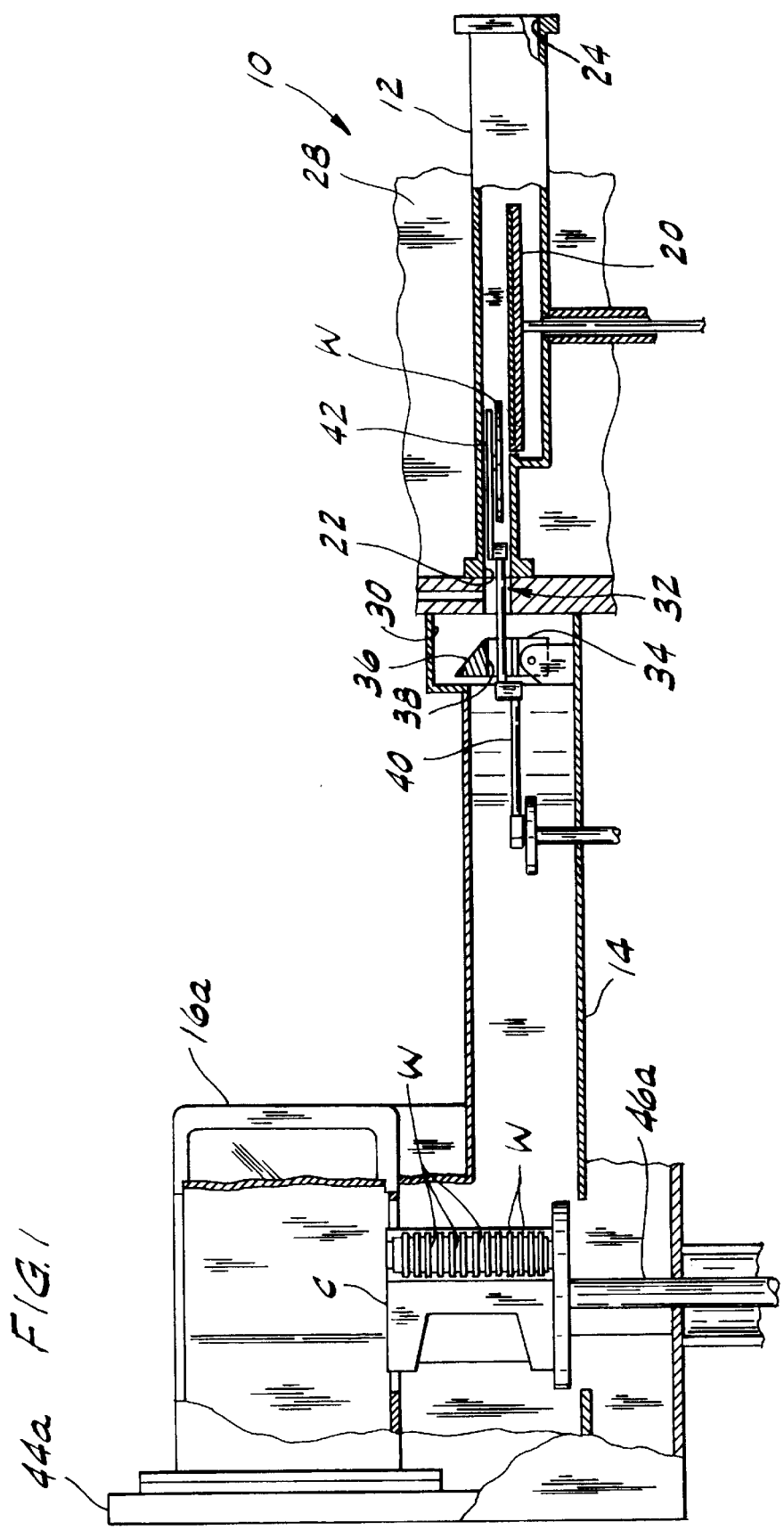
FIG. 1 is an elevation of a reactor of the present invention with portions broken away to show internal construction.
Figure 2:
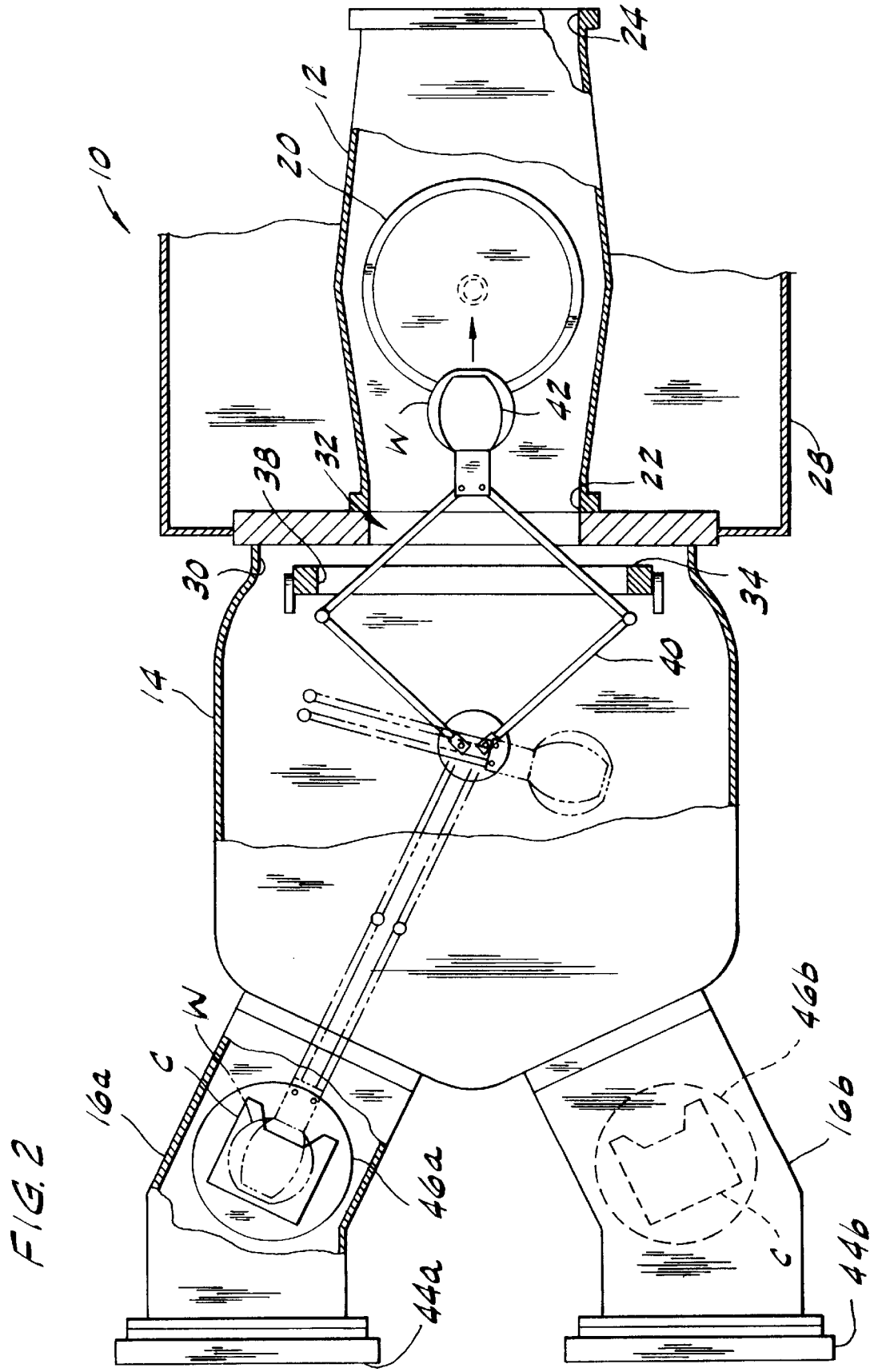
FIG. 2 is a plan of the reactor of the present invention with portions broken away to shown internal construction.

Referring now to the drawings and in particular to FIG. 1, a reactor is designated in its entirety by the reference number 10. The reactor 10 comprises a process chamber 12, a wafer handling chamber 14 and two load locks 16a, 16b (FIG. 2). The process chamber 12 is sized and shaped for receiving a semiconductor wafer W. A turntable 20 in the process chamber 12 rotates the wafer W during the chemical vapor deposition process to evenly distribute the epitaxial layer on the wafer. An opening 22 provided at one end of the process chamber 12 is sized for inserting the wafer W into the chamber. An exhaust port 24 at the end of the process chamber 12 opposite the opening 22 is connected to a facility exhaust 26 (FIG. 3) for purging reactant gas from the process chamber. A conventional heating array enclosure 28 surrounds the process chamber 12.

The wafer handling chamber 14 has an opening 30 aligned with the opening 22 of the process chamber 12 to define a port, generally designated 32, connecting the wafer handling chamber to the process chamber. The wafers W pass through this port 32 when being inserted into and removed from the process chamber 12. A gate 34 is provided adjacent the port 32 to selectively block the port. The gate 34 is pivotable between an open position (shown) and a closed position in which a surface 36 of the gate seals against the port 32. In the open position, the gate 34 is spaced from the port 32 for inserting wafers W into the process chamber 12 and removing them from the chamber. In the closed position, the gate 34 prevents gas flow through the port to isolate the process chamber 12 from the wafer handling chamber 14 during the chemical vapor deposition process. The gate 34 includes a slot 38 sized to permit wafers W to pass through the gate when it is in the open position.

The load locks 16a, 16b are positioned at an end of the wafer handling chamber 14 opposite the process chamber 12. Before and after chemical vapor deposition, wafers W are stored in a cassette C located in one of the load locks (e.g., 16a). As shown in FIG. 2, a robot 40 having a conventional Bernoulli wand 42 moves the wafers W between the load locks 16a, 16b and the process chamber 12. The wand 42 has nozzles (not shown) directed generally outward and slightly downward from its lower surface. Gas is discharged through the nozzles to create a vacuum beneath the wand 42 for lifting a wafer W without touching it. Doors 44a, 44b are provided on the load locks 16a, 16b, respectively, for inserting cassettes C into and removing them from the load locks. Each load lock 16a, 16b also includes an elevator 46a, 46b, respectively, which may be raised to isolate the portion of the respective load lock holding the cassette C and associated wafers W from the wafer handling chamber 14 when loading and unloading the load lock. Other features of the process chamber 12, the wafer handling chamber 14 and the load locks 16a, 16b are conventional and will not be described in detail. Although other reactors 10 may be used without departing from the scope of the present invention, the reactor of the preferred embodiment is a conventional epitaxial reactor such as an ASM® Epsilon One® model E2 reactor. ASM and Epsilon One are federally registered trademarks of Advanced Semiconductor Materials America, Inc. of Phoenix, Ariz.

As illustrated in FIG. 3, a first vent passage 50 extends from the process chamber 12 for purging gas from the process chamber and a second vent passage 52 extends from the wafer handling chamber 14 for purging gas from the wafer handling chamber. Separate vent lines 54 (only one of which is shown) extend from each load lock 16a, 16b (FIG. 2) for purging gas from the load locks. The first vent passage 50 extending from the process chamber 12 is connected to the previously mentioned facility exhaust 26. Likewise, the second vent passage 52 and the vent lines 54 extending from the load locks 16a, 16b are connected to a facility exhaust 56. A choke valve 58 is positioned along the first vent passage 50 extending from the process chamber 12 for selectively controlling gas flow through the vent passage. The choke valve 58 has an open position in which gas is permitted to flow through the vent passage to the facility exhaust 26 for purging gas from the process chamber 12 and a restricting position in which gas is restricted from freely flowing through the vent passage to the facility exhaust. As will be appreciated by those skilled in the art, the choke valve 58 may be eliminated and nitrogen may be introduced into the first vent passage 50 to limit flow from the process chamber 12. A conventional back pressure regulator 60 is positioned along the second vent passage 52.

A bypass line 62 connects the first vent passage 50 to the second vent passage 52 to form a bypass passage, generally designated by 70, which connects the process chamber 12 to the wafer handling chamber 14 for transporting gas between the process chamber and the wafer handling chamber to equalize pressure between the process chamber and the wafer handling chamber when the gate 34 is closed. Although other materials may be used without departing from the scope of the present invention, the bypass line 62 of the preferred embodiment is made of ¼" 316 stainless steel tubing connected to the vent passages 50, 52 with conventional fittings (not shown) such as Swagelok® and VCR® ¼ " fittings. Swagelok is a federally registered trademark of Crawford Fitting Co. of Cleveland, Ohio. VCR is a federally registered trademark of Cajon Co. of Solon, Ohio. Although it is envisioned that other configurations could be adopted without departing from the scope of the present invention, the bypass line 62 of the preferred embodiment is physically spaced from the gate 34 rather than extending through the gate.

A flow restrictor 72 is positioned along the bypass passage 70 for restricting flow through the bypass passage. The restrictor 72 limits the pressure change rate in the process chamber and the wafer handling chamber and thereby limits the maximum velocity of gas flowing through the bypass passage 70. Although another flow restrictor 72 may be used without departing from the scope of the present invention, in the most preferred embodiment the flow restrictor is a metering valve such as a NuPro® model SS-SVCR4-VH metering valve having a variable orifice for selectively varying the rate at which gas flows through the bypass passage 70. NuPro is a federally registered trademark of Nuclear Products Co. of Cleveland, Ohio. Although the orifice may have other sizes without departing from the scope of the present invention, the orifice of the preferred embodiment is sized to prevent the pressures in the process chamber 12 and the wafer handling chamber 14 from being equalized in less than ½ second, and more preferably the orifice is sized to equalize the pressures in about two to about three seconds. The optimal orifice size and equalization period for the particular process chamber geometry may be a determined by experimentation. The orifice size which provides the fastest equalization without degrading the wafer quality is preferred. The orifice also restricts gas flow through the bypass passage so that the pressure change rate in the process chamber 12 is substantially less than possible when the gate 34 is in the open position.

A bypass valve 74 positioned along the bypass passage 70 selectively controls gas flow through the bypass passage. The bypass valve 74 has an open position in which gas is permitted to flow through the bypass passage 70 to equalize pressure between the process chamber 12 and the wafer handling chamber 14, and a closed position in which gas is prevented from flowing through the bypass passage to isolate the process chamber from the wafer handling chamber during the chemical vapor deposition process. Although other valves may be used without departing from the scope of the present invention, the bypass valve 74 of the preferred embodiment is a normally closed, pneumatically controlled valve, such as a NuPro® model number SS-4BK-V51-1C valve, connected to a pneumatic line fed by a pressurized source. Further, although the flow restrictor 72 and bypass valve 74 are separate units in the preferred embodiment, it is envisioned that the flow restrictor and valve could be incorporated into a single valve having a variable orifice without departing from the scope of the present invention.

A bypass valve controller, generally designated by 80, is connected to the bypass valve 74 for signaling the bypass valve to move from its closed position to the open position. The controller 80 generally comprises first, second and third solenoid valves, designated 82, 84 and 86, respectively. Although other solenoid valves may be used without departing from the scope of the present invention, the solenoid valves of the preferred embodiment are Humphrey® model number M31E1 8.5 w 24vDC solenoid valves. Humphrey is a federally registered trademark of Humphrey Products Co. of Kalamazoo, Mich.

A pneumatic line 88 extends from a source 90 of pressurized gas such as air to the bypass valve 74. Each of the solenoid valves 82, 84, 86 is positioned along the pneumatic line 88 for controlling flow through the line. When the solenoid valves 82, 84, 86 are closed, air flow through the pneumatic line 88 is blocked and the bypass valve 74 is closed. However, when all of the solenoid valves 82, 84, 86 are open, air flows through the pneumatic line 88 to open the bypass valve 74. The first solenoid valve 82 is normally closed but is adapted to permit flow through the pneumatic line upon receiving an electrical signal (e.g., 24vDC) from the choke valve 58 by way of an electrical line 92 indicating that the choke valve is in the restricting position. The second solenoid valve 84 positioned along the pneumatic line 88 is normally closed but is adapted to permit flow through the pneumatic line upon receiving an electrical signal (e.g., 24vDC) from a master controller 94 which controls the overall operation of the reactor 10 by way of an electrical line 96. The third solenoid valve 86 positioned along the pneumatic line 88 is normally closed but is adapted to permit flow through the pneumatic line upon receiving an electrical signal (e.g., 24vDC) from the gate 34 by way of an electrical line 98 indicating that the gate is in the closed position. Although three solenoids are used in the preferred embodiment, it is envisioned that fewer solenoids may used with other controllers without departing from the scope of the present invention.

Thus configured, the bypass valve controller 80 permits the bypass valve 74 to move to the open position when the gate 34 is in the closed position and the choke valve 58 is in the restricting position.

Bi-directional transducers 102, 104 are positioned along the vent passage 54 and the bypass line 62 to measure the pressure of the gas at their respective locations. These pressures are indicative of the pressures in the process chamber 12, the wafer handling chamber 14 and the load locks 16a, 16b. Thus, the transducers 102, 104 may be used to confirm that the pressures are equalized in the chambers. Although other transducers may be used without departing from the scope of the present invention, the transducers of the preferred embodiment are MKS® model number 22380-00100-A-B-B bi-direction transducers. MKS is a federally registered trademark of MKS Instruments, Inc. of Andover, Mass.

Pressures in the process chamber 12, the wafer handling chamber 14 and the load locks 16a, 16b vary during the chemical vapor deposition process. When the gate 34 is closed, the difference in pressures can increase due to many factors, which are well understood by those skilled in the art, such as the introduction of reactant gas and purge gas, and the introduction of gas through the Bernoulli wand 42. The system described above equalizes the pressures on opposite sides of the gate 34 to prevent gas from rushing through the port 32 when the gate is opened and thereby to prevent particulate contaminates in the chambers from being dispersed onto the wafers. The process by which the reactor 10 of the present invention is operated will now be described.

Before the wafer W is loaded into the process chamber 12 of the reactor 10, an etchant is introduced into the process chamber to remove material left on the surfaces of the process chamber during previous chemical vapor deposition cycles. The etchant is purged from the process chamber 12, the choke valve 58 is moved to the restricting position and the bypass passage 70 connecting the process chamber and the wafer handling chamber 14 is opened to permit restricted flow through the bypass passage and to equalize pressure in the process chamber and the wafer handling chamber. Once pressure is equalized in the process chamber 12 and the wafer handling chamber 14, the gate 34 between the process chamber and the wafer handling chamber is opened and a semiconductor wafer W is loaded into the process chamber. The wafer W is sealed in the loaded process chamber 12 by closing the gate 34 as previously described, and reactant gas is introduced into the sealed chamber to deposit an epitaxial layer onto the wafer W in a conventional manner.

After an epitaxial layer having the desired thickness is deposited, the reactant gas is vented from the process chamber 12 through the vent passage 50 and the passage is at least partially blocked once the reactant gas is vented from the process chamber. The bypass passage 70 connecting the process chamber 12 and the wafer handling chamber 14 is opened to permit restricted flow through the bypass passage to equalize pressure in the process chamber and the wafer handling chamber. Once the pressure in the process chamber 12 and the wafer handling chamber 14 is sufficiently equalized, the gate 34 is opened and the wafer W is removed from the process chamber using the robot 40.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A system for equalizing pressure across a gate adapted to selectively block a port connecting a wafer handling chamber to a process chamber of a reactor for depositing an epitaxial layer on a semiconductor wafer positioned in the process chamber by a chemical vapor deposition process, the system comprising:
    a bypass passage connecting the process chamber to the wafer handling chamber for transporting gas between the process chamber and the wafer handling chamber when the gate is blocking the port connecting the wafer handling chamber to the process chamber of the reactor for equalizing pressure between the process chamber and the wafer handling chamber;
    a bypass valve positioned along the bypass passage for selectively controlling gas flow through the bypass passage, the bypass valve having an open position in which gas is permitted to flow through the bypass passage to equalize pressure between the process chamber and the wafer handling chamber, and a closed position in which gas is prevented from flowing through the bypass passage to isolate the process chamber from the wafer handling chamber during the chemical vapor deposition process; and
    to limit pressure change rates in the process chamber and the wafer handling chamber when the bypass valve is in the open position and thereby to limit a maximum velocity of gas flowing through the bypass passage.

2. A system as set forth in claim 1 wherein the bypass passage is spaced from the port connecting the process chamber and the wafer handling chamber.

3. A system as set forth in claim 2 wherein a first vent passage extends from the process chamber for purging gas from the process chamber, wherein a second vent passage extends from the wafer handling chamber for purging gas from the wafer handling chamber, and wherein a portion of the bypass passage extends from first vent passage to the second vent passage.

4. A system as set forth in claim 1 wherein the flow restrictor is a metering valve having a variable orifice for selectively varying a rate at which gas flows through the bypass passage.

5. A system as set forth in claim 4 wherein the orifice is sized to prevent equalization of pressure in the process chamber with pressure in the wafer handling chamber in less than ½ second.

6. A reactor for depositing an epitaxial layer on a semiconductor wafer by a chemical vapor deposition process comprising:
    a process chamber sized and shaped for receiving a semiconductor wafer, said process chamber having an opening sized for receiving the wafer into chamber prior to the chemical vapor deposition process and removing the wafer from the chamber after the chemical vapor deposition process;
    a wafer handling chamber for staging wafers prior to insertion into the process chamber and retaining wafers after removal from the process chamber, the wafer handling chamber having an opening aligned with the opening of the process chamber defining a port connecting the wafer handling chamber to the process chamber through which the wafer passes when being inserted into the process chamber and removed from the process chamber;
    a gate for selectively blocking the port connecting the wafer handling chamber to the process chamber, the gate having an open position in which the gate is spaced from the port for inserting wafers into the process chamber prior to chemical vapor deposition and for removing wafers from the chamber after chemical vapor deposition and a closed position in which the gate is sealed against the port to prevent gas flow through the port and thereby isolate the process chamber from the wafer handling chamber during the chemical vapor deposition process;
    a bypass passage connecting the process chamber to the wafer handling chamber for transporting gas between the process chamber and the wafer handling chamber when the gate is blocking the port connecting the wafer handling chamber to the process chamber for equalizing pressure between the process chamber and the wafer handling chamber;
    a bypass valve positioned along the bypass passage for selectively controlling gas flow through the bypass passage, the bypass valve having an open position in which gas is permitted to flow through the bypass passage to equalize pressure between the process chamber and the wafer handling chamber, and a closed position in which gas is prevented from flowing through the bypass passage to isolate the process chamber from the wafer handling chamber during the chemical vapor deposition process; and to limit pressure change rates in the process chamber and the wafer handling chamber when the bypass valve is in the open position and thereby to limit a maximum velocity of gas flowing through the bypass passage.

7. A reactor as set forth in claim 6 wherein the bypass passage is spaced from the port connecting the process chamber and the wafer handling chamber.

8. A reactor as set forth in claim 7 further comprising a first vent passage extending from the process chamber for purging gas from the process chamber and a second vent passage extending from the wafer handling chamber for purging gas from the wafer handling chamber, wherein a portion of the bypass passage extends from first vent passage to the second vent passage.

9. A reactor as set forth in claim 6 wherein the flow restrictor is a metering valve having a variable orifice for selectively varying a rate at which gas flows through the bypass passage.

10. A system as set forth in claim 9 wherein the orifice is sized to prevent equalization of pressure in the process chamber with pressure in the wafer handling chamber in less than ½ second.

11. A system as set forth in claim 6 wherein the flow restrictor is sized for restricting gas flow through the bypass passage so that the pressure change rate in the process chamber is substantially less than when the gate is in the open position.

12. A reactor as set forth in claim 6 further comprising a bypass valve controller connected to the bypass valve for signaling the bypass valve to move from the closed position to the open position.

13. A reactor as set forth in claim 12 wherein the bypass valve controller permits the bypass valve to move to the open position when the gate is in the closed position.

14. A reactor as set forth in claim 6 further comprising a vent passage extending from the process chamber for purging gas from the process chamber to a facility exhaust and a choke valve positioned along the vent passage for selectively controlling gas flow through the vent passage, the choke valve having an open position in which gas is permitted to flow through the vent passage to the facility exhaust for purging gas from the process chamber and a restricting position in which gas is restricted from freely flowing through the vent passage to the facility exhaust, wherein the bypass valve controller permits the bypass valve to move to the open position when the choke valve is in the restricting position.

15. A reactor as set forth in claim 14 wherein the bypass valve is a normally closed pneumatically controlled valve connected to a pneumatic line fed by a pressurized source and the bypass valve controller comprises a solenoid valve positioned along the pneumatic line adapted to permit flow through the pneumatic line upon receiving an electrical signal from the choke valve indicating that the choke valve is in the restricting position.

16. A reactor as set forth in claim 15 wherein said solenoid valve is a first solenoid valve, said electrical signal is a first electrical signal and the reactor further comprises a second solenoid valve positioned along the pneumatic line adapted to permit flow through the pneumatic line upon receiving a second electrical signal from the gate indicating that the gate is in the closed position.

17. A reactor as set forth in claim 16 further comprising:
a master controller for controlling operation of the reactor; and
a third solenoid valve positioned along the pneumatic line adapted to permit flow through the pneumatic line upon receiving a third electrical signal from the master controller.

18. A reactor as set forth in claim 6 further comprising a solenoid valve positioned along the pneumatic line adapted to permit flow through the pneumatic line upon receiving an electrical signal from the gate indicating that the gate is in the closed position.

19. A reactor as set forth in claim 18 wherein said solenoid valve is a first solenoid valve, said electrical signal is a first electrical signal and the reactor further comprises:
a master controller for controlling operation of the reactor; and
a second solenoid valve positioned along the pneumatic line adapted to permit flow through the pneumatic line upon receiving a second electrical signal from the master controller.

20. A reactor as set forth in claim 6 further comprises:
a master controller for controlling operation of the reactor; and
a solenoid valve positioned along the pneumatic line adapted to permit flow through the pneumatic line upon receiving an electrical signal from the master controller.

21. A method of operating a reactor for depositing an epitaxial layer on a semiconductor wafer by a chemical vapor deposition process comprising the steps of:
opening a bypass passage having a flow restrictor therein connecting a process chamber of the reactor and a wafer handling chamber of the reactor to permit restricted flow through the bypass and the flow restrictor, passage and to equalize pressure in the process chamber and the wafer handling chamber;
opening a gate between the process chamber and the wafer handling chamber once pressure is equalized in the process chamber and the wafer handling chamber;
loading a semiconductor wafer in the process chamber;
sealing the loaded process chamber; introducing reactant gas into the sealed chamber venting the reactant gas from the process chamber through a vent passage;
restricting flow through the vent passage once the reactant gas is vented from the process chamber;
repeating the steps of opening the bypass passage connecting the process chamber and the wafer handling chamber and opening the gate between the process chamber and the wafer handling chamber once flow through the vent passage is restricted; and
removing the wafer from the process chamber into the wafer handling chamber.

22. A method of operating a reactor for depositing an epitaxial layer on a semiconductor wafer by a chemical vapor deposition process comprising the steps of:

loading a semiconductor wafer in a process chamber of the reactor;

sealing the loaded process chamber;

introducing reactant gas into the sealed chamber;

venting the reactant gas from the process chamber through a vent passage;

restricting flow through the vent passage once the reactant gas is vented from the process chamber;

opening a bypass passage having a flow restriction therein connecting the process chamber and a wafer handling chamber to permit restricted flow through the bypass passage and the flow restrictor, and to equalize pressure in the process chamber and the wafer handling chamber;

opening a gate between the process chamber and the wafer handling chamber once pressure is equalized in the process chamber and the wafer handling chamber; and removing the wafer from the process chamber into the wafer handling chamber.

* * * * *

UNITED STATES PATENT AND TRADEMARK OFFICE
CERTIFICATE OF CORRECTION

PATENT NO. : 6,086,678
DATED : July 11, 2000
INVENTOR(S) : Gregory M. Wilson, Michael J. Ries, Thomas A. Torack It is certified that error appears in the above-identified patent and that said Letters Patent is hereby corrected as shown below:

Column 8, claim 1
Line 5, "to limit" should read -- a flow restrictor positioned along the bypass passage for restricting gas flow through the bypass passage to limit --.

Column 10, claim 21,
Line 45, "bypass and the flow" should read -- bypass passage and the flow --.
Line 53, "chamber venting" should read -- chamber; venting --.

Signed and Sealed this

Fourth Day of December, 2001

Attest:

NICHOLAS P. GODICI
Attesting Officer    Acting Director of the United States Patent and Trademark Office